United States Patent [19]
Friend et al.

[11] Patent Number: 5,805,416
[45] Date of Patent: Sep. 8, 1998

[54] MODULAR HAND-HELD DATA CAPTURE TERMINAL

[75] Inventors: Steven Darren Friend, Felton; Dennis Silva, San Jose, both of Calif.

[73] Assignee: Norand Corporation, Cedar Rapids, Iowa

[21] Appl. No.: 848,511

[22] Filed: Apr. 28, 1997

Related U.S. Application Data

[63] Continuation of Ser. No. 526,502, Sep. 11, 1995.

[51] Int. Cl.$^6$ ........................................... G06F 1/16
[52] U.S. Cl. ........................... 361/686; 361/683; 361/684; 235/472
[58] Field of Search .................................. 361/679–686; 364/708.1, 709.1, 709.12, 707; 235/472, 462

[56] References Cited

U.S. PATENT DOCUMENTS

| | | |
|---|---|---|
| 4,075,702 | 2/1978 | Davies . |
| 5,123,064 | 6/1992 | Hacker et al. . |
| 5,133,076 | 7/1992 | Hawkins et al. . |
| 5,155,659 | 10/1992 | Kunert . |
| 5,202,817 | 4/1993 | Koenck et al. . |
| 5,218,187 | 6/1993 | Koenck et al. . |
| 5,313,053 | 5/1994 | Koenck et al. . |
| 5,331,136 | 7/1994 | Koenck et al. . |
| 5,349,497 | 9/1994 | Hanson et al. . |
| 5,371,348 | 12/1994 | Kumar ...................................... 235/472 |
| 5,382,962 | 1/1995 | Young . |
| 5,404,267 | 4/1995 | Silva et al. . |
| 5,410,141 | 4/1995 | Koenck et al. . |
| 5,418,684 | 5/1995 | Koenck et al. . |
| 5,461,546 | 10/1995 | Kobayashi et al. . |
| 5,471,042 | 11/1995 | Kikeby et al. ........................... 235/472 |
| 5,479,001 | 12/1995 | Kumar et al. ........................... 235/472 |
| 5,515,303 | 5/1996 | Cargin, Jr. et al. . |
| 5,576,530 | 11/1996 | Hagerty .................................. 235/472 |
| 5,613,095 | 3/1997 | Moss et al. ............................. 395/500 |
| 5,679,943 | 10/1997 | Schultz et al. .......................... 235/472 |
| 5,680,633 | 10/1997 | Koenck et al. .......................... 395/800 |

*Primary Examiner*—Lynn D. Feild
*Attorney, Agent, or Firm*—Suiter & Associates PC

[57] ABSTRACT

A portable, hand-held data collection terminal unit is of modular structure including, among other modules, multiple endcap modules and radio frequency communications pod modules, each of which may be chosen from a plurality of modules available for assembly into the terminal unit thereby providing a plurality of modular combinations thereof. Consequently, a wide combination of terminal units may be assembled form the available modular choices in order to adapt and optimize the utility thereof for particular data collection and communications operations. The modules provide various modes of connectivity and data transfer capability.

4 Claims, 7 Drawing Sheets

MODULAR HAND-HELD DATA CAPTURE TERMINAL

This is a continuation of copending application Ser. No. 08/526,502 filed on Sep. 11, 1995.

The present application hereby incorporates by reference in their entirety the following commonly owned United States Patents:

| U.S. PAT. NO. | Issued |
| --- | --- |
| 5,418,654 | May 23, 1995 |
| 5,410,141 | April 25, 1995 |
| 5,349,497 | September 20, 1994 |
| 5,331,136 | July 19, 1994 |
| 5,313,053 | May 17, 1994 |
| 5,218,187 | June 8, 1993 |
| 5,202,817 | April 13, 1993 |
| 5,123,064 | June 16, 1992 |

TECHNICAL FIELD

The present invention relates generally to data collection and processing systems and specifically to portable data terminals as operator manipulatable data input and output devices modularly adaptable to provide multiple input and output functionality.

BACKGROUND OF THE INVENTION

Portable data terminals are generally known components of state of the art business systems. The data terminals may be taken to merchandise storage facilities for inventory control or customer service transactions, or may be used in any one of various other commercial applications to serve as data input or output devices for central data processing and control stations.

Central data processing and control stations are most useful when business data are always current and readily available. Prompt data entry and retrieval at the working level through various operator controlled portable data terminals is recognized as a basis for optimizing, among various business activities, inventory control and customer service activities, business forecasting and marketing operations, to name just a few.

Increased versatility in data input and output arrangements tends to increase power usage of the portable data terminals, thereby decreasing usage periods between battery exchanges or recharging operations. Touch sensitive or pen actuated data input systems are known. However, in the past, such pen actuated data input systems were generally limited to the use of pens for digitizer boards or in conjunction with full keyboard type computer terminals. While the former devices are considered limited in their application, the latter are bulky, even as laptop computers, and are not useful for practical data entry and retrieval in shop, warehouse, store or delivery environments.

SUMMARY OF THE INVENTION

It is an object of the present invention to provide a small, portable, hand-held data collection terminal of expanded utility in mobile computing systems and in-premise wireless local and wide area networks. The data terminal of the present invention is modularly adaptable to several operational configurations for optimal utilization mobile computing applications including route accounting, field sales automation, inventory management and warehouse data management.

It is another object of the present invention to provide a small, portable, hand-held data collection terminal hand improved versatility and powerful data processing capabilities.

It is a further object of the present invention to provide a data collection terminal optimized for portable use in mobile computing systems which utilizes high speed realtime data collection.

The present invention provides a hand-held data collection terminal having multiple configurations for the data input and output. Multiple modularly configurable modes of data input and output include a display screen having touch screen input capabilities including handwriting signature capture and character recognition, infrared data communications, wireless radio frequency data communications, integrated scanning of optically readable data files including bar code scanning, and tactile keyboard input.

The present invention additionally provides a hand-held data collection terminal having standard personal computer compatibility to allow for the utilization of wide base of software applications previously not available on portable data processing terminals of the type disclosed herein.

BRIEF DESCRIPTION OF THE DRAWINGS

The numerous objects and advantages of the present invention may be better understood by those skilled in the art by reference to the accompanying figures in which.

DETAILED DESCRIPTION OF AN EXEMPLARY EMBODIMENT

Figure 1:
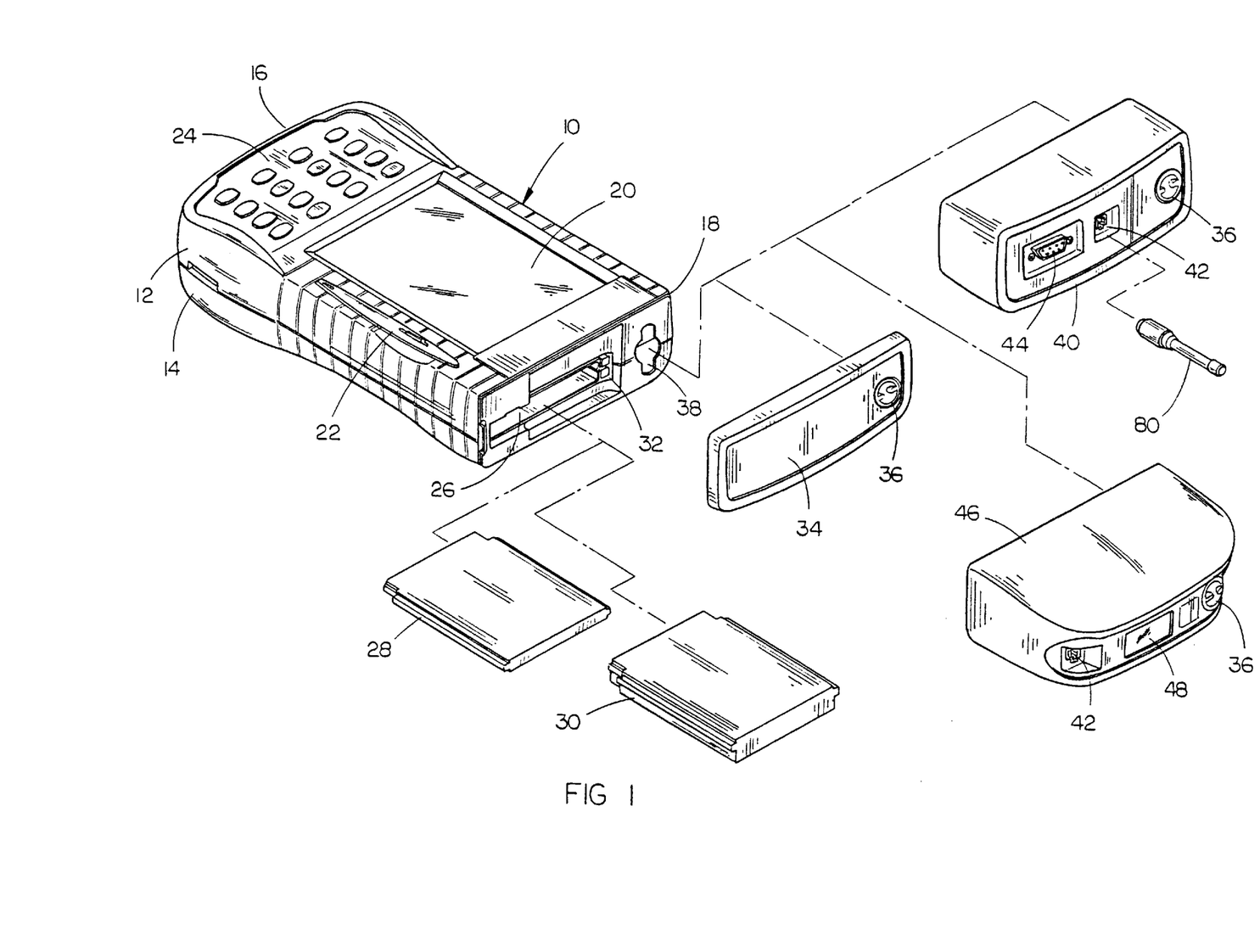
FIG. 1 illustrates an exemplary portable hand-held data collection terminal of the present invention.

FIG. 1 illustrates an exemplary portable hand-held data collection terminal of the present invention generally designated by the numeral 10. The portable data terminal 10 is a hand-held, portable unit which is capable of operating from a self-contained power source. Such a portable data terminal 10 may operate in what is referred to as a batch mode in which data are collected and by, and stored within the data terminal 10 to be transferred to an alternate data processing unit or host computer (not shown) in a comprehensive batch type data transfer operation. In the alternative, the data terminal 10 may be in communication with such a host computer in an interactive or on-line mode via a data communications link such as a radio frequency transceiver arrangement, a cable-type arrangement or an infrared data link.

The data terminal 10, as described herein and viewed from above, generally has an elongate, rectangular shape comprising an upper housing shell 12 and a lower housing shell 14. The data terminal 10 preferably comprises a molded high-impact strength plastic material to provide resistance and durability such that the data terminal may survive multiple drops to concrete from hand-held levels, driving rain and moisture, and extreme operating temperatures. In an exemplary embodiment of the present invention, the data terminal 10 is designed to be operable in environments having a temperature range of −20° C. to 50° C. and storable in environments having as temperature range of −30° C. to 70° C. The data terminal is preferably designed to withstand humidity ranging from 5% to 95% atmospheric humidity and resist rains of up to 6" (1524 mm) rain per hour and winds of up to 40 miles (64 km) per hour.

The data terminal 10, when viewed from above in a typical hand-held position has a lower end portion 16 and a top end portion 18. The data terminal 10 has disposed on the upper housing shell 12 near the top end portion 18 a display screen 20 for displaying viewable information. The display screen 20 is preferably a state of the art liquid crystal display (LCD) screen. State of the art display screens generally utilize double super twist LCD technology. This type of display screen provides satisfactory viewing contrast under most direct lighting conditions. Backlighting of the display screen 20 may be utilized to provide supplemental illumination of the display screen. Power management considerations may entertain selective illumination in accordance with varying ambient light levels. The contrast control of the LCD display 20 preferably includes automatic temperature compensated contrast control.

The display screen 20 preferably provides a rectangular display area comprising a 240 (width)×320 (length) pixel array being a standard CGA format controlled display having a VGA driver interface and 4 gray scales. The display screen 10 further provides touch screen actuated data input and user interface control. The display screen preferably responds to tactile stimuli such as the finger of the operator or an input stylus 22. Signature capturing capabilities are further provided by utilization of the input stylus 22. Touch screen interface functions are provided by utilization of various software environments such as MS-DOS™ or Microsoft Windows with Pen Extension™ available from Microsoft Corporation, Power PenPal™ available from PenPal Associates, or Pen Right™ Pro available from PenRight Corporation, for example. The portable data collection terminal 10 of the present invention preferably utilizes a 386SL 33 MHz PC architecture microprocessor in order to run in 386 enhanced mode. The data terminal 10 further utilizes power management in order to prolong battery life.

The data terminal 10 preferably includes a numeric 16-key keypad 24 disposed on the upper housing shell 12 near the bottom end 16. The keyboard preferably provides tactile keying response for feedback of successful keyboard entry. The keys of the keypad 24 are preferably ergonomically shaped to the human fingertip and are arranged and color coded according to function to enhance key recognition and enhance the speed of key entry. The keypad 24 may further provide multiple interchangeable keypad overlays to accommodate multiple keypad function arrangements. The keypad 24 preferably includes multi-directional control keys providing navigation control functions for the display screen 20 such as scrolling, for example.

The data terminal 10 preferably has disposed at the top end 18 a PCMCIA card receptacle 26 to removably receive and utilize standard PCMCIA cards (alternatively referred to as PC cards). The PCMCIA card receptacle 26 is preferably designed to utilize two Type II PCMCIA cards such as PC card 28 or one Type III PCMCIA cards such as PC card 30. The PCMCIA card may be utilized to provide various peripheral and supplemental computer functions such as extended volatile random access memory (RAM), extended nonvolatile semipermanent memory such as FLASH memory, modem functions, and radio frequency transceivers including RF WAN (wide area network) and RF LAN (local area network) cards, for example. The PCMCIA cards may be removed from the PCMCIA card receptacle 26 by PC card ejector buttons 32.

The data terminal 10 may utilize a standard end cap 34 at the top end 18 of the data terminal 10 to provide enclosure of the PCMCIA card receptacle 26. The end cap 34 preferably comprises high-impact-resistant plastic enclosed with co-molded rubber to provide impact protection and shock absorption. The endcap 34 has disposed on one side a quick-release lock assembly 36 which may provide quick-releasing and securing of the endcap 34 to the top end 18 of the data terminal 10. The lock assembly 36 preferably corresponds to a lock aperture 38 disposed at the top end 18 of the data terminal 10. The lock aperture 38 may receive the lock assembly 36 and fasten or release the endcap 24 when the lock assembly is rotated for a one-quarter turn.

In an exemplary embodiment of the present invention, the data terminal 10 is designed to modularly utilize various types of modular endcaps. The type of modular endcap to be utilized may be determined by the particular data collection and transfer functions desired and by the particular configuration of the data terminal. For example, the data terminal 10 may utilize a data port endcap 40 having multiple data ports such as an RJ-11 modular phone jack 42 and a 9-pin d-sub serial connector 44. The data port endcap 40 may be utilized in lieu of a standard endcap 34 in conjunction with a PC card modem to provide a phone jack receptacle 42, for example. The RJ-11 phone jack 42 may be replaced with an antenna 80 for connection to a PCMCIA modem card to provide an RF link rather than a direct wire link, for example. The 9-pin d-sub connector 44 may be utilized to provide a serial port connection to a peripheral device such as a printer, for example. The data port endcap 40 preferably has substantially the same quick-release lock assembly 36 as the standard endcap 34 which may be slightly more elongated to accommodate the large size of the data port endcap 40.

The data terminal 10 may also utilize a laser scanner modular endcap 46 having laser scanner circuitry therein for scanning of optically readable data files such as bar codes, for example. The laser scanner module 46 includes a laser scanner window 48 and may include an RJ-11 phone jack 42. The laser scanner module also has substantially the same type of quick-release lock assembly 36 as the data port endcap 40 and the standard endcap 34 with an even longer lock assembly 36 to accommodate the larger size of the laser scanner module 46. The lock assembly 36 of the laser scanner module 46 may be further modified to generally conform the contours of the laser scanner module 46 when the module 46 is secured to the top end 18 of the data terminal 10.

The scanner module endcap 46 may utilize standard and long range integrated laser scanners for laser scanning functions such as laser scanning of standard bar code labels. Alternatively, the scanner module endcap 46 may utilize charge coupled device (CCD) circuitry for two dimensional optically readable data file reading such as for reading state of the art two dimensional data code files. A tethered scanner unit may be utilized as well.

Figure 2:
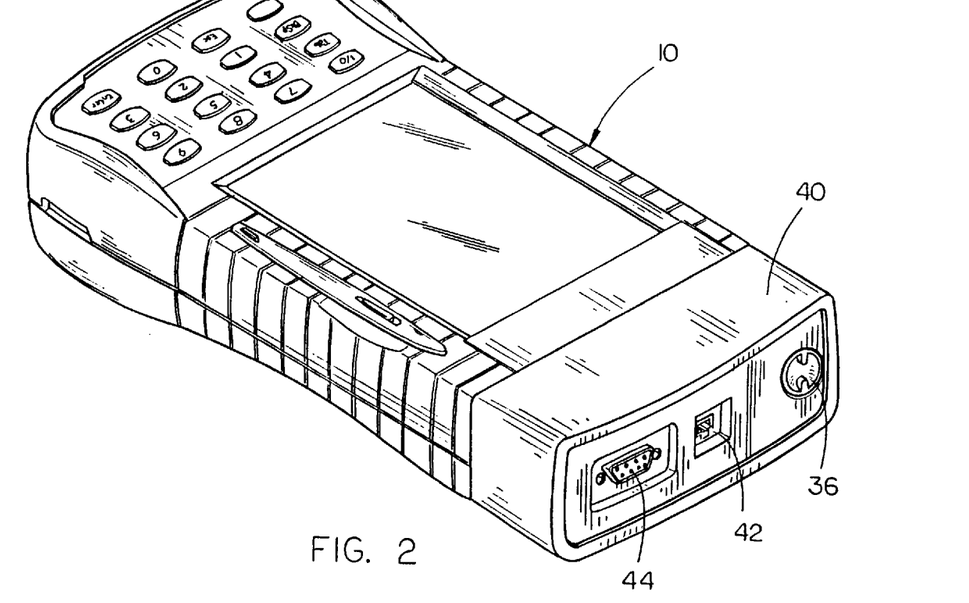
FIG. 2 illustrates in isometric view the portable data terminal of the present invention utilizing an optional modular endcap.

FIG. 2 illustrates in isometric view the portable data terminal of the present invention utilizing an optional modular endcap. The data terminal 10 may utilize various endcaps in order to achieve various terminal configurations to provide multiple terminal functions. The data terminal 10 may utilize, for example, a data port modular endcap 40 to provide the data terminal 10 with various input and output ports. A standard RJ-11 modular phone jack 42 may be utilized to provide standard phone cable connections to provide modem communication functions. A 9-pin d-sub serial port connector 44 may be utilized for standard serial port data communications such as standard RS-232 or RS485 communications. Alternate configurations of the data port endcap are also contemplated in which other types of data ports may be utilized such as standard parallel port connectors, for example. The modular endcaps preferably provide the data terminal 10 with a singular contiguous form thereby becoming an integral part of the structure of the data terminal 10 as shown in FIG. 2.

Figure 3:
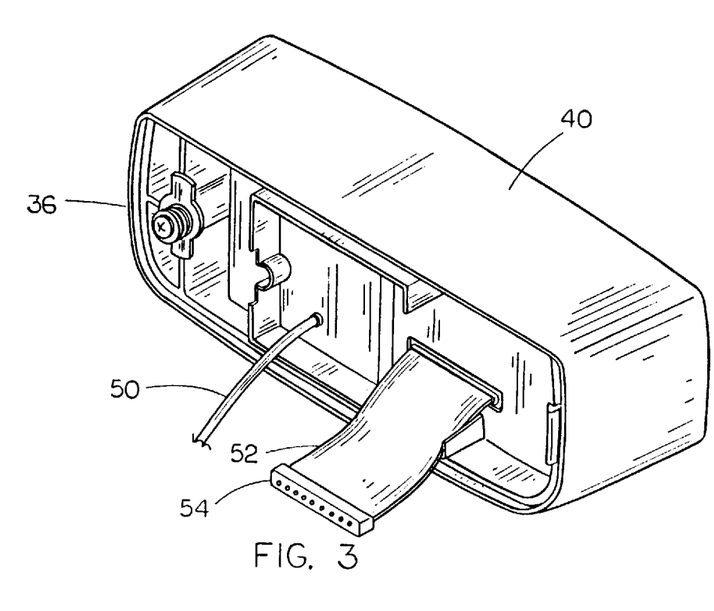
FIG. 3 is a perspective view of the rear side of a modular endcap utilized with the present invention.

FIG. 3 is a perspective view of the rear side of a modular endcap. The endcap 40 has a quick-release lock assembly 36 corresponding to a lock aperture 38 disposed at the top end 18 of the data terminal 10 as shown in FIG. 1. The data port endcap 40 has corresponding wire connections such as phone jack cable 50 which connects the RJ-11 modular phone jack 42 as shown in FIG. 2 with a PC card modem such as PC cards 28 and 30 shown in FIG. 1. The 9-pin d-sub connector 44 of the data port endcap 40 shown in FIG. 1 may connect with an internal PC card such as cards 28 and 30 of FIG. 1. The connection may be made with a flexible circuit connector 52 having a terminating connector 54 which may connect with a corresponding receiving connector (not shown) of a PC card.

Figure 4:
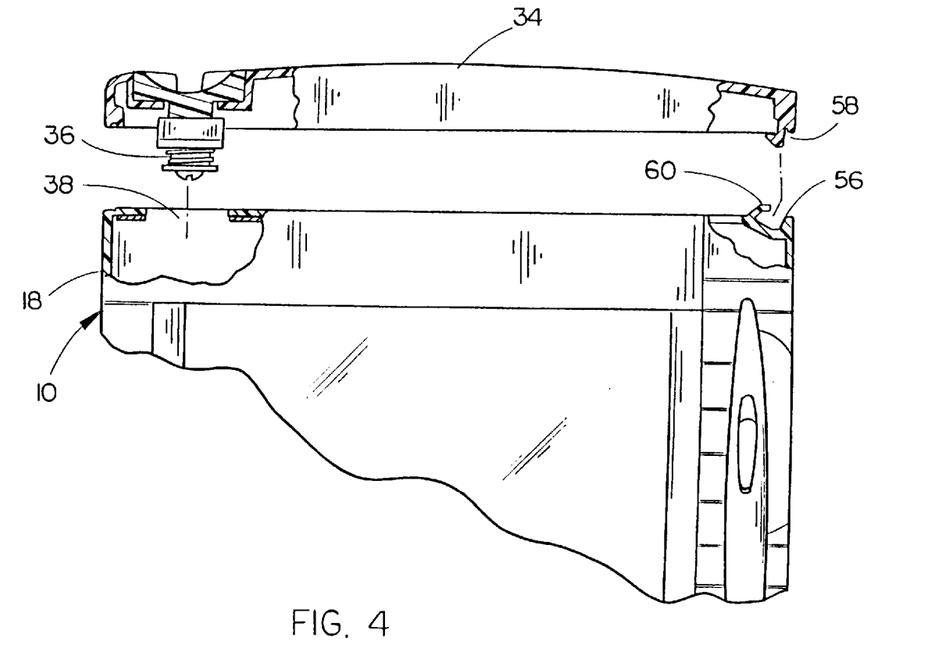
FIG. 4 illustrates in top cutaway view the quick-release fastening apparatus of a modular endcap to the portable data collection terminal of the present invention.

FIG. 4 illustrates in top cutaway view the quick-release fastening apparatus of a modular endcap to the portable data collection terminal of the present invention. A standard endcap 34 is shown to be removably fastened to the top end 18 of the data terminal 10. A hook receiving latch 56 may be disposed at the top end 18 of the data terminal at one side to receive a corresponding hook fastener 58 disposed at one end of the endcap 34. The hook fastener 58 may engage with the hook receiving latch 56 providing secure coupling of the endcap 34 with the data terminal 10. The coupling arrangement of the hook fastener 58 and the hook receiving latch 56 coupling allows for some degree of pivotal movement of the endcap about the point of coupling relative to the data terminal. The quick-release lock assembly 36 is preferably disposed at the distal end of the endcap 34 with respect to the point of coupling 60. The pivotal movement of the endcap 34 allows for the lock assembly 36 to be inserted into or removed from the lock aperture 38 disposed at the top end 18 of the data terminal 10 in a position corresponding to the lock assembly 38.

Figure 5:
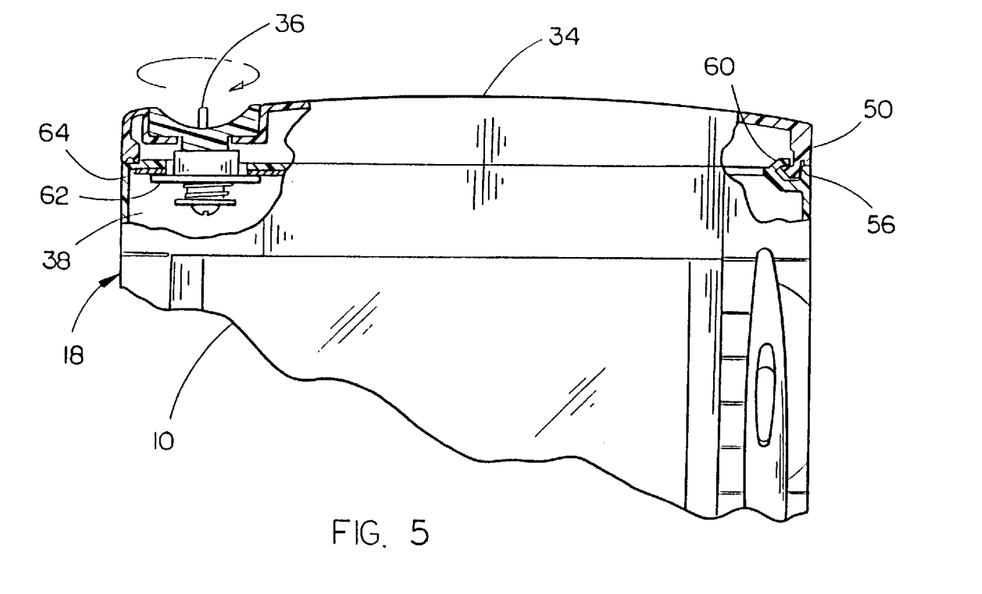
FIG. 5 illustrates in top cutaway view the quick-release fastening of a modular endcap to the portable data collection terminal of the present invention.

FIG. 5 illustrates in top cutaway view the quick-release fastening of a modular endcap to the portable data collection terminal of the present invention. The lock assembly 36 of the endcap 34 may be positioned within the lock aperture 38 at the top end 18 of the data terminal 10. Rotation of the lock assembly 36 by one-quarter turn provides quick-release securing of the endcap 34 to the data terminal 10. A rectangular metal plate 62 may be positioned by the rotation of the of the lock assembly 36 such that the plate 62 comes into forcible contact with the interior surface 64 of the lock aperture, thereby securing the endcap 34 to the data terminal 10. The endcap 34 is also secured to the data terminal 10 by the forcible contact of the hook fastener 58 to the hook receiving latch 56 at the rotational pivot point 60. Rotation of the lock assembly 36 in the opposite direction positions the plate 62 such that it may freely pass through the lock aperture 38.

Figure 6:
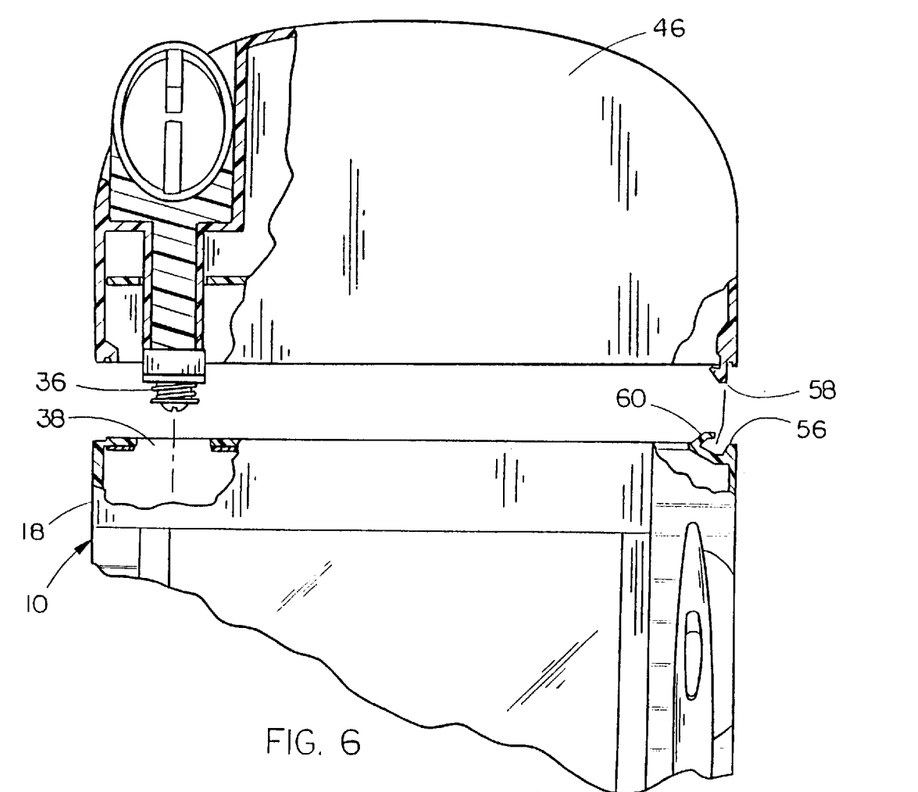
FIG. 6 illustrates in top cutaway view the quick-release fastening apparatus of an alternative modular endcap to the portable data collection terminal of the present invention.

FIG. 6 illustrates in top cutaway view the quick-release fastening apparatus of an alternative modular endcap to the portable data collection terminal of the present invention. An endcap such as laser module endcap 46 is shown to be removably fastened to the top end 18 of the data terminal 10. A hook receiving latch 56 may be disposed at the top end 18 of the data terminal at one side to receive a corresponding hook fastener 58 disposed at one end of the endcap 46. The hook fastener 58 may engage with the hook receiving latch 56 providing secure coupling of the endcap 46 with the data terminal 10. The coupling arrangement of the hook fastener 58 and the hook receiving latch 56 coupling allows for some degree of pivotal movement of the endcap about the point of coupling relative to the data terminal. The quick-release lock assembly 36 is preferably disposed at the distal end of the endcap 46 with respect to the point of coupling 60. The pivotal movement of the endcap 46 allows for the lock assembly 36 to be inserted into or removed from the lock aperture 38 disposed at the top end 18 of the data terminal 10 in a position corresponding to the lock assembly 38.

Figure 7:
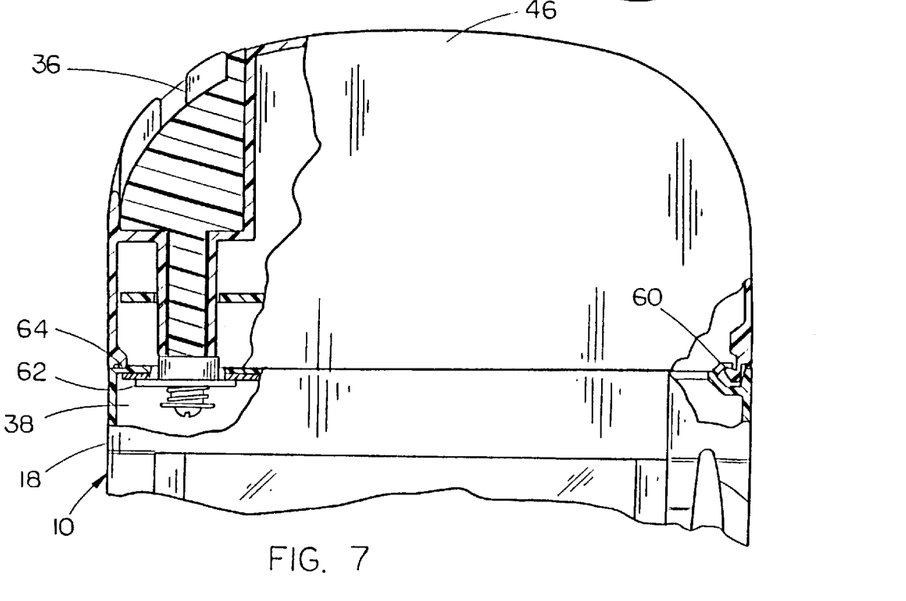
FIG. 7 illustrates in top cutaway view the quick-release fastening of an alternative modular endcap to the portable data collection terminal of the present invention.

FIG. 7 illustrates in top cutaway view the quick-release fastening of an alternative modular endcap to the portable data collection terminal of the present invention. The locking assembly 36 of the endcap 46 may be positioned within the lock aperture 38 at the top end 18 of the data terminal 10. Rotation of the lock assembly 36 by one-quarter turn provides quick-release securing of the endcap 46 to the data terminal 10. A rectangular metal plate 62 may be positioned by the rotation of the of the latch assembly 36 such that the plate 62 comes into forcible contact with the interior surface 64 of the lock aperture 38, thereby securing the endcap 46 to the data terminal 10. The endcap 46 is also secured to the data terminal 10 by the forcible contact of the hook fastener 58 to the hook receiving latch 56 at the rotational pivot point 60. Rotation of the lock assembly 36 in the opposite direction positions the plate 62 such that it may freely pass through the lock aperture 38. When in the locked position the top end of the lock assembly is contoured to generally conform to the contour features of the endcap 46.

Figure 8:
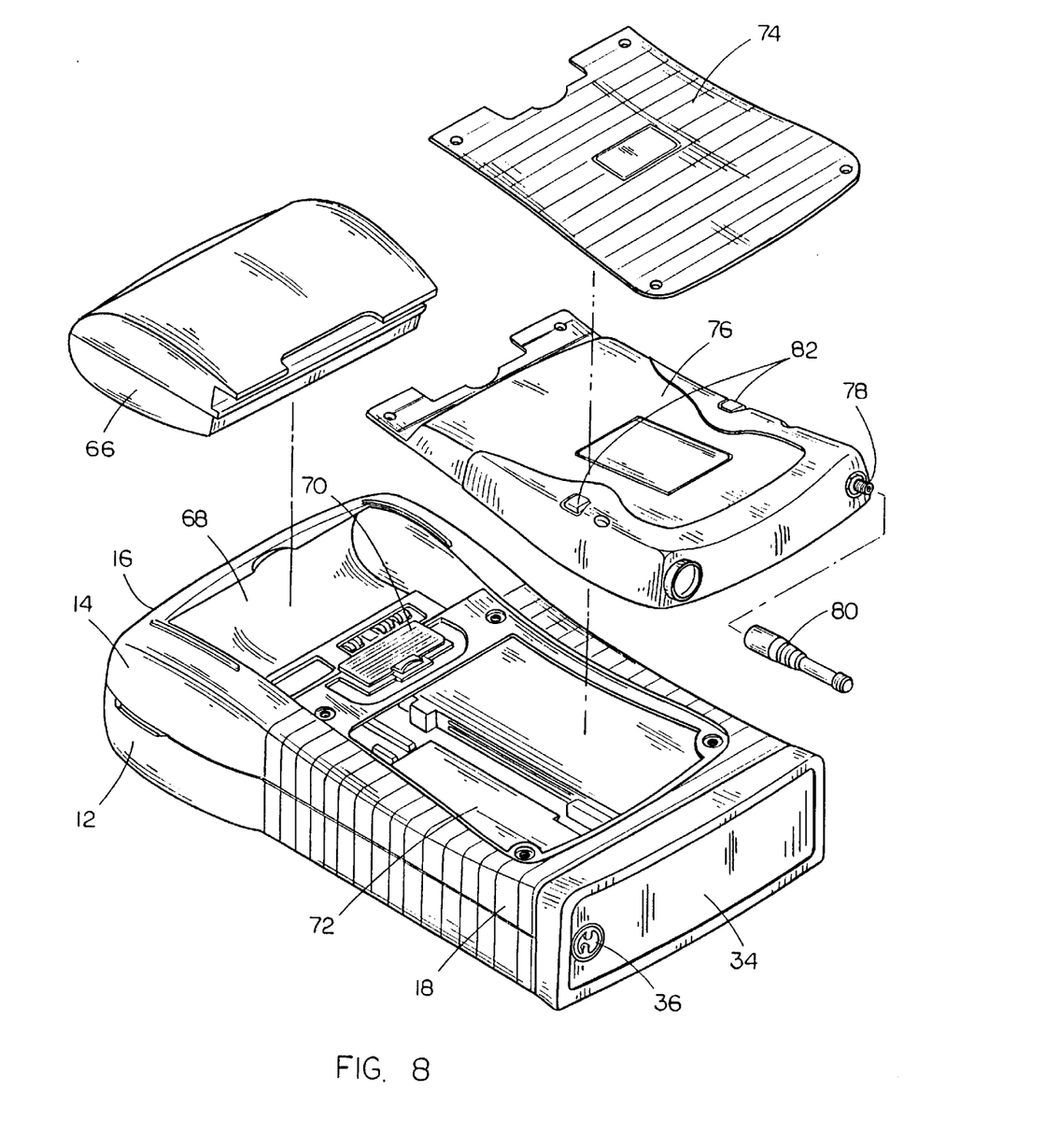
FIG. 8 illustrates in isometric view the attachment of accessories to the underside of the modular data terminal of the present invention.

FIG. 8 illustrates in isometric view the attachment of accessories to the underside of the modular data terminal of the present invention. The data terminal 10 shown in FIG. 8 shows the lower housing shell 14 viewable from above with the upper housing shell 12 viewable from below the data terminal 10 such that the data terminal 10 may be considered to be facing down. The lower housing shell 14 may have disposed near the lower end 16 of the data terminal a battery cavity 68 for removably receiving a rechargeable battery pack 66. The battery pack 66 may be removably secured within the battery cavity 66 with a battery latch 70. The battery pack 66 provides the data terminal 10 with power during portable operation thereof. The battery pack 66 preferably utilizes lithium ion electrochemical cells and has built in charge management and fuel gauge indication electronics. The battery pack 66 may be charged external to the data terminal 10 or while utilized therewith such as while the terminal 10 is mounted for use in a vehicle, depot or home dock. The battery pack 66 may be fully charged in 2.5 hours using fast charging routines.

The data terminal 10 preferably has a pod cavity 72 disposed on the lower housing shell 14 near the top end 18. The pod cavity 72 exposes the internal circuitry of the data terminal 10 such that internal circuitry may be accessed. The pod cavity 72 allows for the user to add additional electronic memory to the data terminal as desired. The data terminal 10 may include as standard 1 megabyte of FLASH memory for storing DOS and BIOS programs which may be upgradable to 2, 4 or 8 megabytes of FLASH memory, for example. Additionally, the data terminal 10 may include as standard 1 megabyte of RAM memory, preferably DRAM, which may be upgradable to 2, 4 or 8 megabytes of RAM memory, for example.

A standard back cover 74 may be normally utilized to cover the pod cavity 72 when no external pod is utilized. Alternatively, an external pod such as radio pod 76 may be modularly attached to the data terminal 10 and utilized for a particular data collection and processing application. Radio pod 76 may replace the standard back cover 74 to cover the pod cavity 72 and thereby become part of the lower housing shell 14 of the data terminal 10. The external pod 76 may contain a radio communications transceiver module therein to provide wireless RF data communications. Radio pod 76 may include a standard coaxial RF antenna connector 78 for attachment and utilization of various types of antennas such as antenna 80. Antennas of varying length, or telescopic antennas for example, may be utilized to provide varying antenna gains depending upon the desired range of RF communication operation. Alternatively, the radio pod 76 may utilize an internal antenna in lieu of an external antenna 80. The accessory pod 76 may include a set of buttons 82 for control of various terminal functions.

Figure 9:
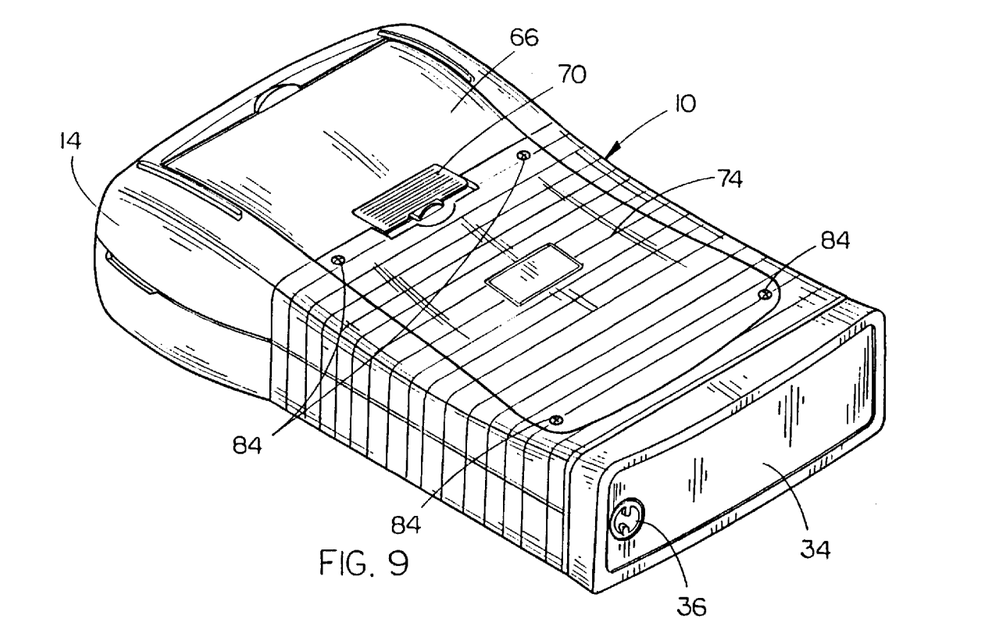
FIG. 9 depicts the underside of the portable data collection terminal of the present invention showing a standard back cover.

FIG. 9 depicts the underside of the portable data collection terminal of the present invention showing a standard back cover. The data terminal 10 is shown in FIG. 9 with the lower housing shell 14 facing upwards. The battery pack 66 when inserted into the data terminal 10 and secured with battery latch 70 preferably conforms to the surface contours of the data terminal 10 such that it becomes contiguously integrated with the lower housing shell 14. The standard back cover 74 also conforms to the surface contours of the data terminal 10 when fastened thereto and also becomes contiguously integrated with the lower housing shell 14. The standard back cover 74 completely covers the pod cavity 72 of FIG. 8. The standard back cover 74 is preferably fastened to the data terminal 10 with four standard fasteners 84 which are preferably number 2 screws. The data terminal 10 of FIG. 7 is shown with a standard endcap 34 secured to the data terminal 10 with lock assembly 36.

Figure 10:
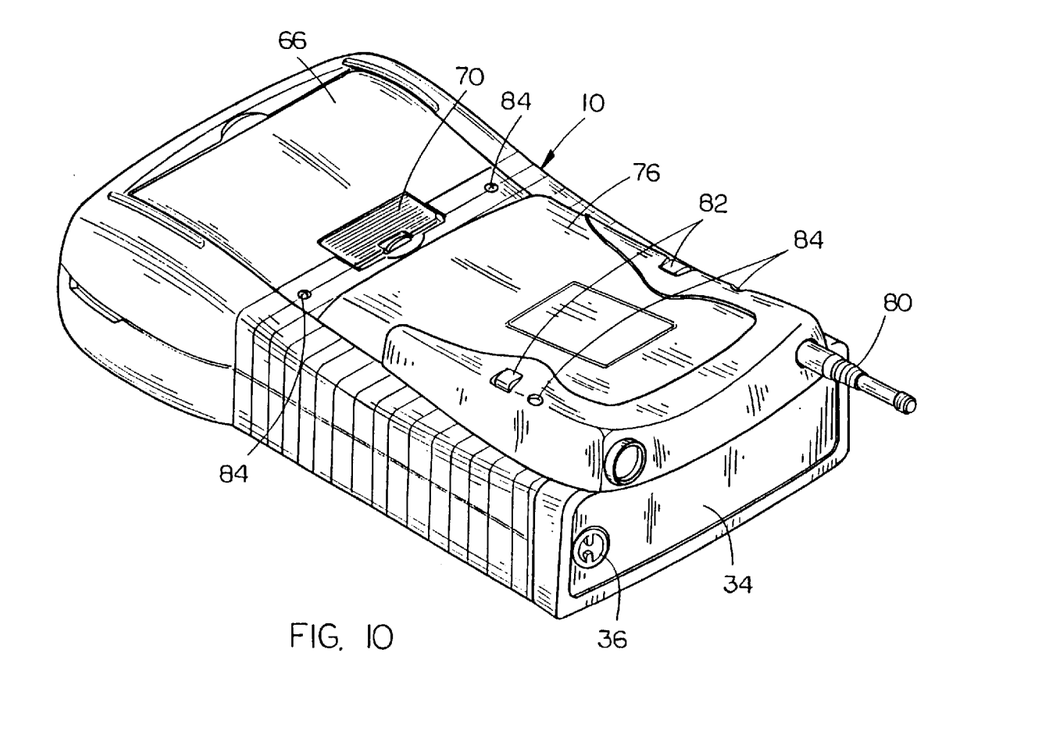
FIG. 10 depicts the data terminal of FIG. 9 with a radio pod secured to the data terminal in lieu of a standard back cover.

FIG. 10 depicts the data terminal of FIG. 9 with a radio pod 76 secured to the data terminal 10 in lieu of a standard back cover 74. The radio pod 76 may be fastened to the data terminal 10 using the same standard fasteners 84 that secured the standard back cover 74 to the data terminal 10 as shown in FIG. 9. The radio pod 76 preferably generally conforms to the surface contours of the data terminal 10 when fastened thereto and becomes generally contiguously integrated with the lower housing shell 14. The radio pod 76 preferably has a low profile in accordance with the hand-held size and functionality of the data terminal 10. An external antenna 80 may be utilized to enhance the radio signal strength. Pod buttons 82 shown on the radio pod 76 may be utilized to initiate and control various data collection and transfer functions. The radio pod 76 preferably provides various types of radio frequency data communications including wide area communications networks, local area communications networks and Ethernet compatible systems.

Figure 11:
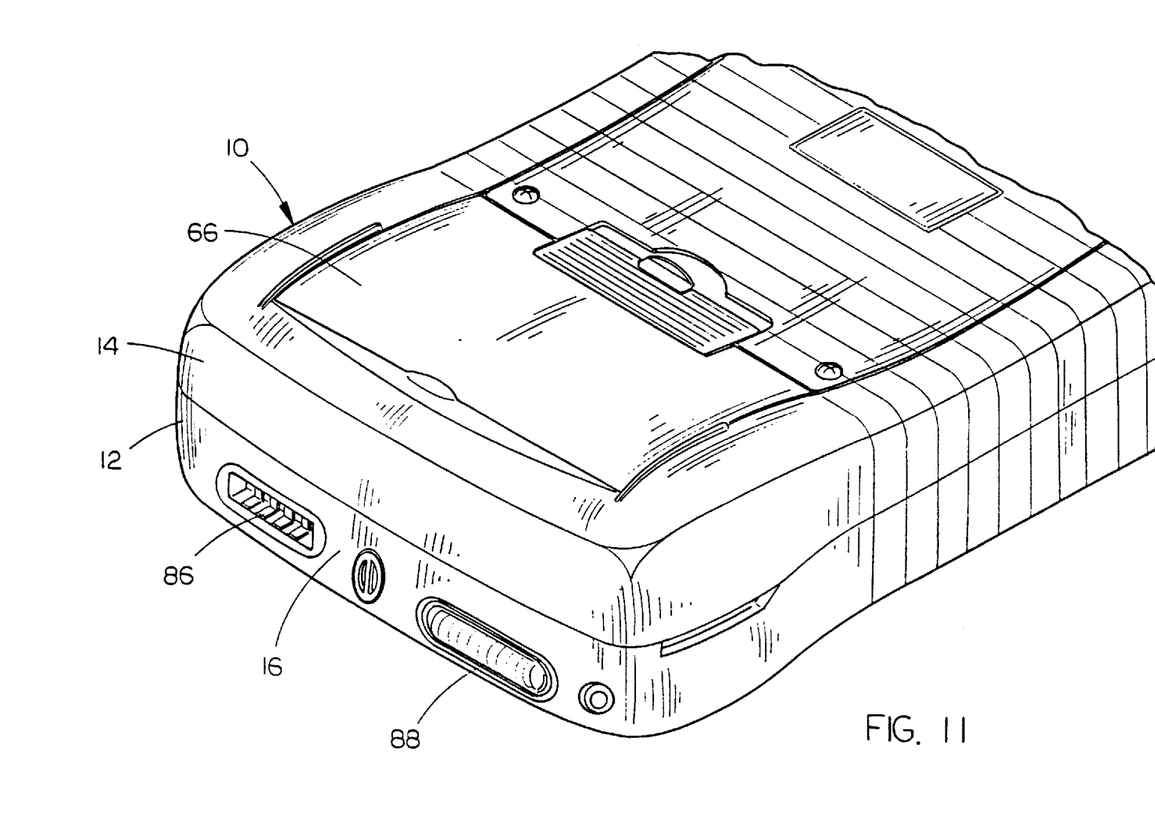
FIG. 11 illustrates additional communications ports disposed on an end of the data terminal of the present invention.

FIG. 11 illustrates additional communications ports of the portable data collection terminal of the present invention. The data terminal 10 preferably has additional communications ports disposed at on the upper housing shell 12 at the bottom end 16. A docking port 86 may provide for the transfer of power into the data terminal 10 for charging an internally contained battery pack 66 while the terminal 10 is docked in a vehicle or home base docking station (not shown). Data communications are preferably provided as well with the dock station such that collected data may be batched to a host computer (not shown) and new program software may be downloaded into the nonvolatile semipermanent FLASH memory of the data terminal 10 as needed. An infrared data communications port 88 is preferably provided for two-way infrared data communications for data batching while the data terminal 10 is not docked, for example. The data communications port 88 preferably provides for infrared data communications conforming to IrDA (Infrared Developers Association) standards.

In view of the above detailed description of a preferred embodiment and modifications thereof, various other modifications will now become apparent to those skilled in the art. The contemplation of the invention below encompasses the disclosed embodiments and all reasonable modifications and variations without departing from the spirit and scope of the invention.

We claim:

1. A hand-held data collection terminal system, comprising:
   (a) a hand-held data terminal having a housing said housing including:
      (1) a front portion having a removable endcap,
      (2) a bottom portion having a removable door,
      (3) a user input and output, and
      (4) a battery opening for removably receiving an electrochemical power cell;
   (b) an interchangeable feature endcap for removable attachment to said front portion upon removal of said removable endcap;
   (c) an interchangeable feature pod for removable attachment to said bottom portion upon removal of said removable door;
   (d) an electrochemical power cell; and
   (e) said hand-held data terminal including a microprocessor circuit for controlling terminal functions and for communicating data and control signals to and from said terminal according to a predetermined operational mode of the microprocessor circuit of said terminal and said interchangeable feature endcap and said interchangeable feature pod.

2. The hand-held data collection terminal system according to claim 1, wherein said interchangeable feature endcap is a data port endcap.

3. The hand-held data collection terminal system according to claim 1, wherein said interchangeable feature endcap is an optical character set reader.

4. The hand-held data collection terminal system according to claim 1, wherein said interchangeable feature pod is a radio transceiver.

* * * * *

UNITED STATES PATENT AND TRADEMARK OFFICE
CERTIFICATE OF CORRECTION

PATENT NO : 5,805,416
DATED : September 8, 1998
INVENTOR(S) : Steven D. Friend et al.

It is certified that error appears in the above-identified patent and that said Letters Patent is hereby corrected as shown below:

On title page, item 57 Abstract
replace "form"
with --from--.

Signed and Sealed this

Twelfth Day of January, 1999

Attest:

Attesting Officer     *Acting Commissioner of Patents and Trademarks*